(12) United States Patent
Plumhoff

(10) Patent No.: US 7,749,400 B2
(45) Date of Patent: Jul. 6, 2010

(54) METHOD FOR ETCHING PHOTOLITHOGRAPHIC SUBSTRATES

(76) Inventor: Jason Plumhoff, 12890 Pine Way Dr., Largo, FL (US) 33773

( * ) Notice: Subject to any disclaimer, the term of this patent is extended or adjusted under 35 U.S.C. 154(b) by 841 days.

(21) Appl. No.: 11/634,377

(22) Filed: Dec. 4, 2006

(65) Prior Publication Data

US 2007/0138136 A1    Jun. 21, 2007

Related U.S. Application Data

(60) Provisional application No. 60/751,349, filed on Dec. 16, 2005.

(51) Int. Cl.
| B44C 1/22 | (2006.01) |
| C03C 15/00 | (2006.01) |
| C03C 25/68 | (2006.01) |
| C23F 1/00 | (2006.01) |

(52) U.S. Cl. ............................ 216/67; 216/75; 438/715

(58) Field of Classification Search ................ 438/715; 216/67, 75; 430/5; 156/345.53
See application file for complete search history.

(56) References Cited

U.S. PATENT DOCUMENTS

| 5,002,631 | A | 3/1991 | Giapis et al. |
| 5,085,750 | A | 2/1992 | Soraoka et al. |
| 5,194,118 | A | 3/1993 | Shinohara |
| 5,268,070 | A | 12/1993 | Nagayama et al. |
| 5,328,558 | A | 7/1994 | Kawamura |
| 5,354,416 | A | 10/1994 | Okudaira et al. |
| 5,607,009 | A | 3/1997 | Turner et al. |
| 5,643,473 | A | 7/1997 | Tachi et al. |
| 5,645,683 | A | 7/1997 | Miyamoto |
| 5,814,563 | A | 9/1998 | Ding et al. |
| 5,900,162 | A | 5/1999 | Kawahara et al. |
| 5,902,088 | A | 5/1999 | Fairbairn et al. |
| 5,981,913 | A | 11/1999 | Kadomura et al. |
| 6,063,710 | A * | 5/2000 | Kadomura et al. .......... 438/715 |
| 6,123,862 | A | 9/2000 | Donahoe et al. |
| 6,156,666 | A | 12/2000 | Tokushima |
| 6,165,377 | A | 12/2000 | Kawahara et al. |
| 6,201,998 | B1 | 3/2001 | Lin et al. |
| 6,312,616 | B1 | 11/2001 | Chinn et al. |
| 6,337,277 | B1 | 1/2002 | Chou et al. |
| 6,580,955 | B2 | 6/2003 | Lin et al. |
| 6,602,348 | B1 | 8/2003 | Rogelstad |
| 6,620,737 | B2 | 9/2003 | Saito et al. |

(Continued)

OTHER PUBLICATIONS

Kwon, et al., Dry Etching: of Cr layer and Its Loading Effect, SPIE,, 2001, pp. 382-389 vol. 4409.

(Continued)

*Primary Examiner*—Roberts Culbert
(74) *Attorney, Agent, or Firm*—Harvey Kauget; Phelps Dunbar LLP

(57) ABSTRACT

The present invention provides a method for processing a photolithographic substrate within a vacuum chamber. The method comprising the steps of cooling the photolithographic substrate to a target temperature before the photolithographic substrate is processed within the vacuum chamber. At least one processing gas is introduced into the vacuum chamber. After the photolithographic substrate is at the target temperature, a plasma is ignited from the processing gas wherein the photolithographic substrate is processed using the plasma. Upon completion of the processing, the photolithographic substrate is unloaded from the vacuum chamber.

17 Claims, 5 Drawing Sheets

U.S. PATENT DOCUMENTS

| | | | |
|---|---|---|---|
| 6,676,804 | B1 | 1/2004 | Koshimizu et al. |
| 2001/0001839 | A1 | 5/2001 | Lin et al. |
| 2002/0055799 | A1 | 5/2002 | Lin et al. |
| 2003/0173346 | A1 | 9/2003 | Renken |
| 2004/0040509 | A1 | 3/2004 | Lu et al. |
| 2004/0209477 | A1 | 10/2004 | Buxbaum et al. |
| 2005/0028928 | A1* | 2/2005 | Asa .................. 156/345.5 |
| 2005/0112891 | A1* | 5/2005 | Johnson et al. ............. 438/691 |
| 2005/0130451 | A1 | 6/2005 | Lee et al. |
| 2005/0153565 | A1 | 7/2005 | Baik |

OTHER PUBLICATIONS

Kwon, et al., Loading Effect Parameters at Dry Etcher System and Their Analysis at Mask-to-mask Loading and Within-Mask Loading, SPIE, 2002, pp. 79-87, vol. 4562.

Bell, Plasma Etching of Chrome Masks Using PBS Resist, SPIE, 1990, pp. 446-451, vol. 1264.

Chen, et al., Impact of Loading Effect on CD Control in Plasma Etching of CR Photomask Using ZEP7000 Resist, SPIE, 1998, pp. 429-437, vol. 3546.

Takanori, et al., Precise Chrome Etching in Downstream Chlorine Plasmas with Electron Depletion Through Negative Ion Production, J ECS, 2000, pp. 4289-4293, 147 (11).

Kang, et al., Etch Characteristics of Cr by Using Cl2/O2 Gas Mixtures with Electron Cyclotron Resonance Plasma, J ECS, 2001, pp. G237-G240, 148 (5).

Marumoto, et al., Fine Pattern Etching of W-Ti Absorber for X-Ray Mask with Electron Cyclotron Resonance Discharge Plasmas, Jpn, J. Appl. Phys., 1993, pp. 5918-5923, vol. 32.

Aoyama, et al., Advanced Cr Dry Etching Process, SPIE, 1999, pp. 137-146, vol. 3748.

Tachi, et al., Low Temperature Dry Etching, JVST A 9 (3), May/Jun. 1991 pp. 796-803.

Wu, Thermodynamic Study of Photomask Plasma Etching, SPIE, 2004, pp. 1195-1206, vol. 5567.

Wu et al., 65 nm node photomask etching with zero CD process bias, SPIE, 2005, vol. 5992.

* cited by examiner

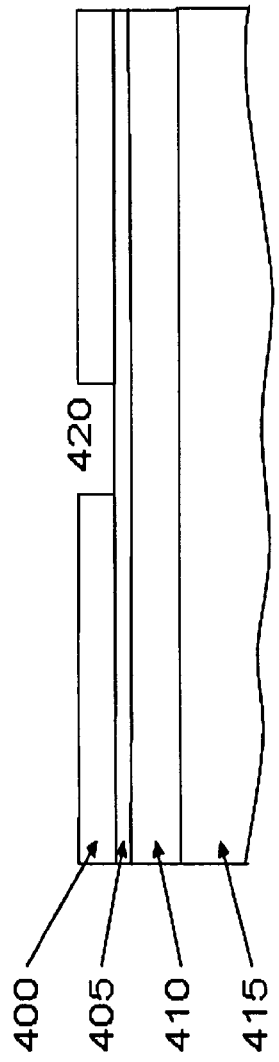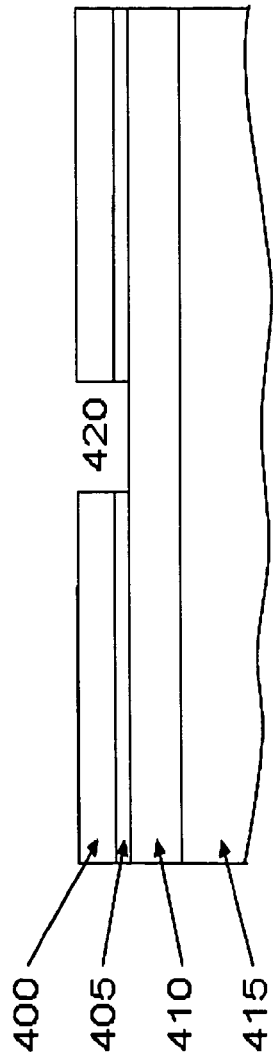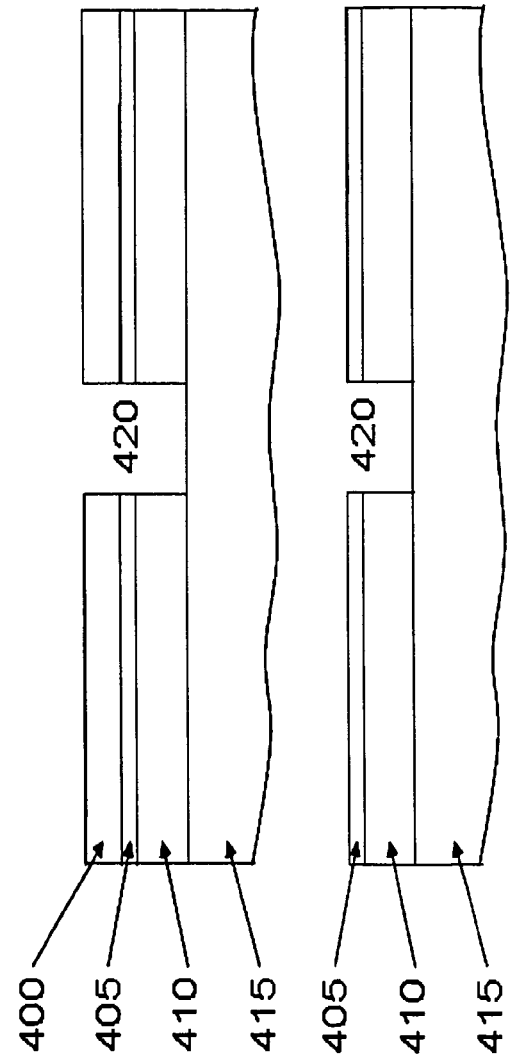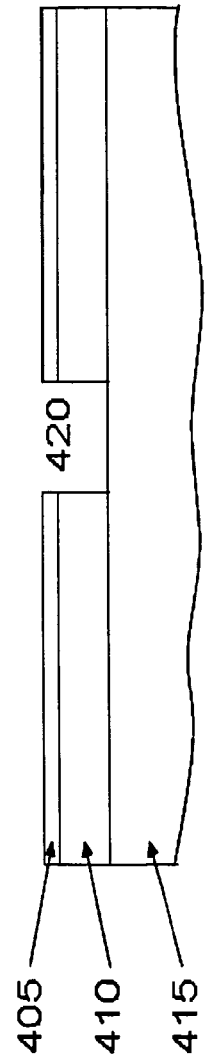

METHOD FOR ETCHING PHOTOLITHOGRAPHIC SUBSTRATES

CROSS REFERENCES TO RELATED APPLICATIONS

This application claims priority from and is related to commonly owned U.S. Provisional Patent Application Ser. No. 60/751,349 filed Dec. 16, 2005, entitled: Improved Method for Etching Photolithographic Substrates, this Provisional Patent Application incorporated by reference herein.

FIELD OF THE INVENTION

The present invention generally relates to semiconductor processing, and in particular to an improved method for etching photolithographic substrates.

BACKGROUND

In order to improve device performance, semiconductor device circuit densities continue to increase. This increase in circuit density is realized by decreasing feature sizes. Current technologies target feature sizes of 0.15 microns and 0.13 microns with further decreases expected in the near future.

The exact dimensions of features within the devices are controlled by all steps in the fabrication process. Vertical dimensions are controlled by doping and layering processes where as horizontal dimensions are determined primarily by photolithographic processes. The horizontal widths of the lines and spaces that make up the circuit patterns are often referred to as critical dimensions (CD).

Photolithography is the technique used to form the precise circuit patterns on the substrate surface. These patterns are transferred into the wafer structure by a subsequent etch or deposition process. Ideally the photolithography step creates a pattern that exactly matches the design dimensions (correct CD) at the designed locations (known as alignment or registration).

Photolithography is a multi-step process where the desired pattern is first formed on a photomask (or reticle). The pattern is transferred to the substrate through a photomasking operation where radiation (e.g., UV light) is transmitted through the patterned photomask exposing a radiation sensitive coating on the substrate. This coating (photoresist) undergoes a chemical change upon exposure to the radiation rendering the exposed areas either more or less soluble to a subsequent development chemistry. Photolithography techniques are well known in the art. An overview of these techniques can be found in the text *Introduction to Microlithography* edited by Thompson et. al.

Since the photomask acts as the master for generating the circuit patterns on a large number of substrates, any imperfections introduced during the manufacturing of the photomask will be replicated on all wafers imaged with that photomask. Consequently, fabricating a high quality photomask that faithfully represents the designed patterns and dimensions is critical to creating high yield device manufacturing processes.

There are two major types of photomask reticles that are well known in the art: absorber and phase shifting. An absorber photomask typically consists of an optically transparent substrate (e.g., fused-quartz, $CaF_2$, etc.) that is coated with an opaque film (e.g., Cr). The opaque film may consist of a single layer or multiple materials (e.g., an anti-reflective layer (AR chromium) on top of an underlying chromium layer). In the case of binary chromium photomasks, examples of commonly used opaque films (listed by trade name) include, but are not limited to, AR8, NTAR7, NTAR5, TF11, TF21. During fabrication of the photomask, the opaque film is deposited on the transparent substrate. A photoresist layer is then deposited on top of the opaque layer and patterned (e.g., exposure to a laser or electron beam). Once exposed, the photoresist layer is then developed to expose areas of the underlying opaque film that are to be removed. A subsequent etch operation removes the exposed film forming the absorber photomask.

There are two subcategories of phase shifting masks that are well known in the art: alternating and embedded attenuating masks. Alternating phase shift masks typically consist of an optically transparent substrate (e.g., fused-quartz, $CaF_2$, etc.) that is coated with an opaque film (e.g., Cr and antireflective Cr). During fabrication of the photomask, the opaque film is deposited on the transparent substrate. A photoresist layer is then deposited on top of the opaque layer and patterned using a laser or electron beam. Once exposed, the photoresist layer is then developed to expose areas of the underlying opaque film that are to be removed. An etch process removes the exposed opaque film exposing the underlying substrate. A second process is used to etch a precise depth into the underlying substrate. Optionally the substrate may be subjected to a second photoresist coat and develop process prior to the second etch process as is known in the art.

Embedded attenuating phase shift masks (EAPSM) typically consist of an optically transparent substrate (e.g., fused-quartz, $CaF_2$, etc.) that is coated with a film or stack of films that attenuate the transmitted light while shifting the phase 180 degrees at a desired wavelength. An opaque film or film stack (e.g., Cr and antireflective Cr) is then deposited on the phase shift material. A photoresist layer is then deposited on top of the opaque layer and patterned (e.g., using a laser or electron beam). Once exposed, the photoresist layer is then developed to expose areas of the underlying opaque film that are to be removed. An etch process is then used to remove the exposed opaque film exposing the underlying phase shifting/attenuating film or film stack. Following the etching of the opaque film, a second etch process is used to etch the phase shift layer stopping on the underlying substrate. Alternatively, an etch stop layer may be present between the phase shift layer and the substrate, in which case the second etch process will selectively stop at the etch stop layer.

Ideally, the etch process will have a high etch selectivity to both the topmost etch resistant mask (e.g., photoresist, e-beam resist, etc.) and underlying material (substrate or etch stop) while creating features that have smooth vertical side walls that exactly replicate the CD of the original mask (e.g., photoresist) pattern. Wet etch processes (e.g., aqueous solutions of chloric acid and ceric ammonium nitrite for AR Cr/Cr etch) show good etch selectivity to the etch mask and underlying substrate, but are isotropic and result in significant undercut of the mask and result in sloped feature profiles. The undercut and sloped feature profiles result in changes to the etched feature CD. The undesirable change in CD and/or sloped feature profiles degrade the optical performance of the finished photomask.

Dry etch (plasma) processes are a well known alternative to wet etch processing. Plasma etching provides a more anisotropic etch result than wet processes. Dry etching is commonly used in the fabrication of all three mask types. In the case of binary Cr photomasks, a mixture of chlorine containing gas and oxygen containing gas are typically used. Additional gas components including inerts and passivants which have been used to improve process performance.

Early dry etch work on photomasks utilized low density (~$10^9$ ion/cm$^3$) plasma in a capacitively coupled (diode) reactor while most current dry etch photomask processes utilize high density ($10^{10}$-$10^{12}$ ions/cm$^3$) configurations (e.g., inductively coupled plasma (ICP), transformer coupled plasma (TCP), electronic cyclotron resonance (ECR), etc.).

For the case of a dry etch process for a binary Cr photomask, the process typically consists of three primary steps. The first step removes the antireflective coating (e.g., chrome oxide, chromium nitride, chromium oxynitride) using a chlorine containing plasma (e.g., $Cl_2$, HCl, $CCl_4$, $BCl_3$). Optionally, the AR Cr etch step may include an oxygen containing gas (e.g., $O_2$, CO, $CO_2$, $N_2O$, $NO_2$, $SO_2$, etc.) as well as inert gases (e.g., He, Ar, Ne, Xe, Kr, etc.). The first step may be run on a timed basis, or terminated at the AR Cr/Cr interface through the use of an endpoint technique (e.g., laser reflectance spectroscopy, optical emission spectroscopy).

The second step etches the bulk Cr material stopping on the underlying film or substrate. The process gas mixture for the second step typically contains a chlorine source and an oxygen source. As with the first step, the process gas mixture may also contain inert gases. Furthermore, the first and second steps may have identical process conditions. Optionally, the second step may be terminated through the use of an endpoint technique.

The third step is an overetch step to ensure that areas of different Cr loadings are completely cleared. The over etch step is also used to improve the sloped profiles seen in low Cr density areas. While longer overetch times ensure that high density Cr areas are completely cleared with improved (more vertical) feature profiles, longer overetch times also result in more lateral etching and higher CD bias. The overetch step parameters may be identical to either (or both) of the first and second step recipes. The duration of the overetch step is typically based on a percentage of the duration of a preceding step.

Optionally a descum or trim step may be performed prior to etching the AR chrome layer in order to improve the etch mask (e.g., photoresist) profile.

While plasma etch processes are more anisotropic than wet etch processes, they can still introduce dimensional changes in the patterned material. The degree of loss or gain in CD introduced during the etch process is referred to as "CD bias." CD bias for the etch process can be calculated by taking the final feature CD after the etch process and subtracting the initial CD of the feature before etch. It is desirable to minimize the extent of lateral etching that contributes to CD bias.

In the cases where the process CD bias is non-zero, the CD bias uniformity must be considered. The CD bias uniformity is the distribution of values around the average CD bias value. The CD bias uniformity may have both systematic and random components. One systematic non-uniformity that has been observed in photomask etching corresponds to local etch loading effects (e.g., micro-loading or loading effect).

The phenomena commonly referred to as "load dependence" is known in the art for dry etch processes. Load dependence refers to the relationship between the area of exposed material to be etched and the material etch rate. For example, in a binary Cr photomask dry etch process, the vertical Cr etch rate is lower in areas with higher Cr densities. Presuming that lateral etch rate is also load dependent, it is reasonable to expect that higher Cr densities will have lower lateral etch rates and as a result a lower CD bias. In practice however, the opposite is observed—higher Cr density features (with lower vertical etch rates) typically have a higher CD bias when compared to lower Cr density (lower load) areas.

In order to evaluate the CD performance of a process, two factors need to be considered: the lateral etch rate of the Cr film stack, and the final profile of the etched feature. In the case of Cr etching, where the pattern contains areas of different Cr loading, features in the higher Cr density (high photoresist density or clear) areas typically etch at slower etch rates (as expected) but show a larger CD bias as compared to low load areas (unexpected).

There is a need for an improved method to fabricate a photomask with improved feature profiles and CD performance.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a method for processing a photolithographic substrate, comprising loading the photolithographic substrate into a vacuum chamber; cooling the photolithographic substrate to a target temperature; introducing at least one processing gas into said vacuum chamber; igniting a plasma from said processing gas after said cooling step; processing the photolithographic substrate using said plasma; and unloading the photolithographic substrate from said vacuum chamber.

Yet another object of the present invention is to provide a method for processing a photolithographic substrate, comprising loading the photolithographic substrate onto a substrate support within a vacuum chamber; controlling the temperature of the photolithographic substrate through a fluid; introducing at least one processing gas into said vacuum chamber; igniting a plasma from said processing gas; processing the photolithographic substrate using said plasma; and unloading the photolithographic substrate from said vacuum chamber.

Still yet another object of the present invention is to provide a method of etching a photolithographic substrate, comprising loading the photolithographic substrate onto a substrate support within a vacuum chamber; introducing at least one processing gas into said vacuum chamber; igniting a first plasma from said processing gas; etching the photolithographic substrate for a first set of process conditions using said first plasma; cooling the photolithographic substrate to a target temperature; igniting a second plasma from said processing gas after said cooling step; etching the photolithographic substrate for a second set of process conditions using said second plasma; and unloading the photolithographic substrate from said vacuum chamber.

Another object of the present invention is to provide a method of controlling the temperature of a substrate with a high thermal mass during a plasma process, comprising adjusting the temperature of the substrate to a target temperature; loading the substrate onto a substrate support within a vacuum chamber; introducing at least one processing gas into said vacuum chamber; igniting a plasma from said processing gas; processing the substrate using said plasma; and unloading the substrate from said vacuum chamber.

Yet another object of the present invention is to provide a method of etching a photolithographic substrate, comprising loading the photolithographic substrate onto a substrate support within a vacuum chamber; introducing at least one processing gas into said vacuum chamber; igniting a plasma from said processing gas; etching the photolithographic substrate at a first target temperature at a first set of process conditions using said plasma; etching the photolithographic substrate at a second target temperature at a second set of process conditions using said plasma; and unloading the photolithographic substrate from said vacuum chamber.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises an improved method for etching photolithographic substrates using a plasma system.

A feature of the present invention is to provide a method for processing a photolithographic substrate, e.g., binary Cr photomask or an embedded attenuating phase shift mask, on a substrate support within a vacuum chamber. The method comprising the steps of cooling the photolithographic substrate to a target temperature, e.g., less than about minus thirty degrees Celsius, before the photolithographic substrate is processed, e.g., etched, using a plasma within the vacuum chamber. The cooling of the photolithographic substrate can occur either in the vacuum chamber where the photolithographic substrate is processed or in a separate chamber that does not have to be under a vacuum. At least one processing gas, e.g., a chlorine containing gas and an oxygen containing gas is introduced into the vacuum chamber. The chlorine containing gas can be introduced at a ratio of greater than about fifteen to one to the oxygen containing gas. After the photolithographic substrate is at the target temperature, a plasma is ignited from the processing gas wherein the photolithographic substrate is processed using the plasma. In addition, the processing of the photolithographic substrate can be modulated based on time, e.g., amplitude modulation or pulse modulation. Upon completion of the processing, the photolithographic substrate is unloaded from the vacuum chamber.

Another feature of the present invention is to provide a method for processing a photolithographic substrate, e.g., binary Cr photomask or an embedded attenuating phase shift mask. The method comprising the steps of controlling the temperature of the photolithographic substrate through a fluid, e.g., an inert gas that is at a pressure of less than about one Torr, during the processing, e.g., etching, of the photolithographic substrate within a vacuum chamber. The fluid can be temperature controlled and the fluid can flow continuously through the vacuum chamber. In addition, at least one chamber surface of the vacuum chamber can be temperature controlled, wherein the chamber surface can be positioned approximately five centimeters from a surface of the photolithographic substrate. The substrate support within the vacuum chamber for supporting the photolithographic substrate can comprise at least three points for making minimal contact with the photolithographic substrate. Upon completion of the processing, the photolithographic substrate is unloaded from the vacuum chamber.

Yet another feature of the present invention is to provide a method of etching a photolithographic substrate, e.g., binary Cr photomask, within a vacuum chamber. The method comprising the steps of introducing at least one processing gas into the vacuum chamber. Igniting a first plasma from the processing gas and then etching the photolithographic substrate for a first set of process conditions using the first plasma. The first set of process conditions can be designed to etch an antireflective layer of the photolithographic substrate. In addition, the photoresist layer on the photolithographic substrate can be stripped prior to etching any remaining Cr on the photolithographic substrate. The photolithographic substrate is cooled to a target temperature before any further processing of the photolithographic substrate. The cooling of the photolithographic substrate can occur either in the vacuum chamber where the photolithographic substrate is processed or in a separate chamber that does not have to be under a vacuum. Once the target temperature for the photolithographic substrate is achieved, a second plasma is ignited from the processing gas and the photolithographic substrate is etched using a second set of process conditions using the second plasma. Upon completion of the processing, the photolithographic substrate is unloaded from the vacuum chamber.

Still yet another feature of the present invention is to provide a method of controlling the temperature of a substrate with a high thermal mass during a plasma process. The method comprising the steps of adjusting the temperature of the substrate on a substrate support to a target temperature within a vacuum chamber. At least one processing gas is introduced into the vacuum chamber. A plasma is ignited from the processing gas wherein the substrate is processed using the plasma. The substrate can be thermally isolated from the substrate support. In addition, the plasma process can be designed to introduce less than 0.5 watts per centimeter squared into the substrate. Upon completion of the processing, the substrate is unloaded from the vacuum chamber.

Another feature of the present invention is to provide a method for processing a photolithographic substrate, e.g., binary Cr photomask or a MoSiON phase shift photomask, on a substrate support within a vacuum chamber. The method comprising the steps of introducing at least one processing gas into the vacuum chamber. A plasma is ignited from the processing gas wherein the photolithographic substrate is etched at a first target temperature at a first set of process conditions using the plasma. Then, the photolithographic substrate is etched at a second target temperature at a second set of process conditions using said plasma. The second target temperature can be either higher or lower than the first target temperature depending on the material to be etched from the photolithographic substrate. The cooling or heating of the photolithographic substrate can occur either in the vacuum chamber where the photolithographic substrate is processed or in a separate chamber that does not have to be under a vacuum. In addition, the first set of process conditions can be designed to etch an antireflective layer of the photolithographic substrate and the photoresist layer on the photolithographic substrate can be stripped prior to etching any remaining Cr on the photolithographic substrate. Or, the first set of process conditions can be designed to etch a MoSiON layer of the MoSiON phase shift photomask and the etch can be stopped at the interface of the MoSiON layer to the surface of the MoSiON phase shift photomask. Upon completion of the processing, the photolithographic substrate is unloaded from the vacuum chamber.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 4a is a schematic of a typical photomask etch process showing the mask structure prior to etch;

FIG. 4b is a schematic of a typical photomask etch process showing the etch step to remove the AR coating;

FIG. 4c is a schematic of a typical photomask etch process showing the etch step to remove the opaque layer;

FIG. 4d is a schematic of a typical photomask etch process showing the step to remove the photoresist layer;

Similar reference characters refer to similar parts throughout the several views of the drawings.

DETAILED DESCRIPTION OF THE INVENTION

Aspects of the invention will be described in reference to an inductively coupled plasma chamber. Suitable etch chambers include the Mask Etcher IV platform available from Oerlikon USA of St. Petersburg, Fla. Other reactor configurations may be used to perform the processes of the invention including capacitively coupled reactors (e.g., reactive ion etcher (RIE), plasma enhanced (PE) reactors, triode reactors, etc.), high density reactors (e.g., ICP, TCP, etc.) and magnetically enhanced reactors (e.g., ECR, magnetically enhanced reactive ion etcher (MERIE), etc.).

Figure 1:
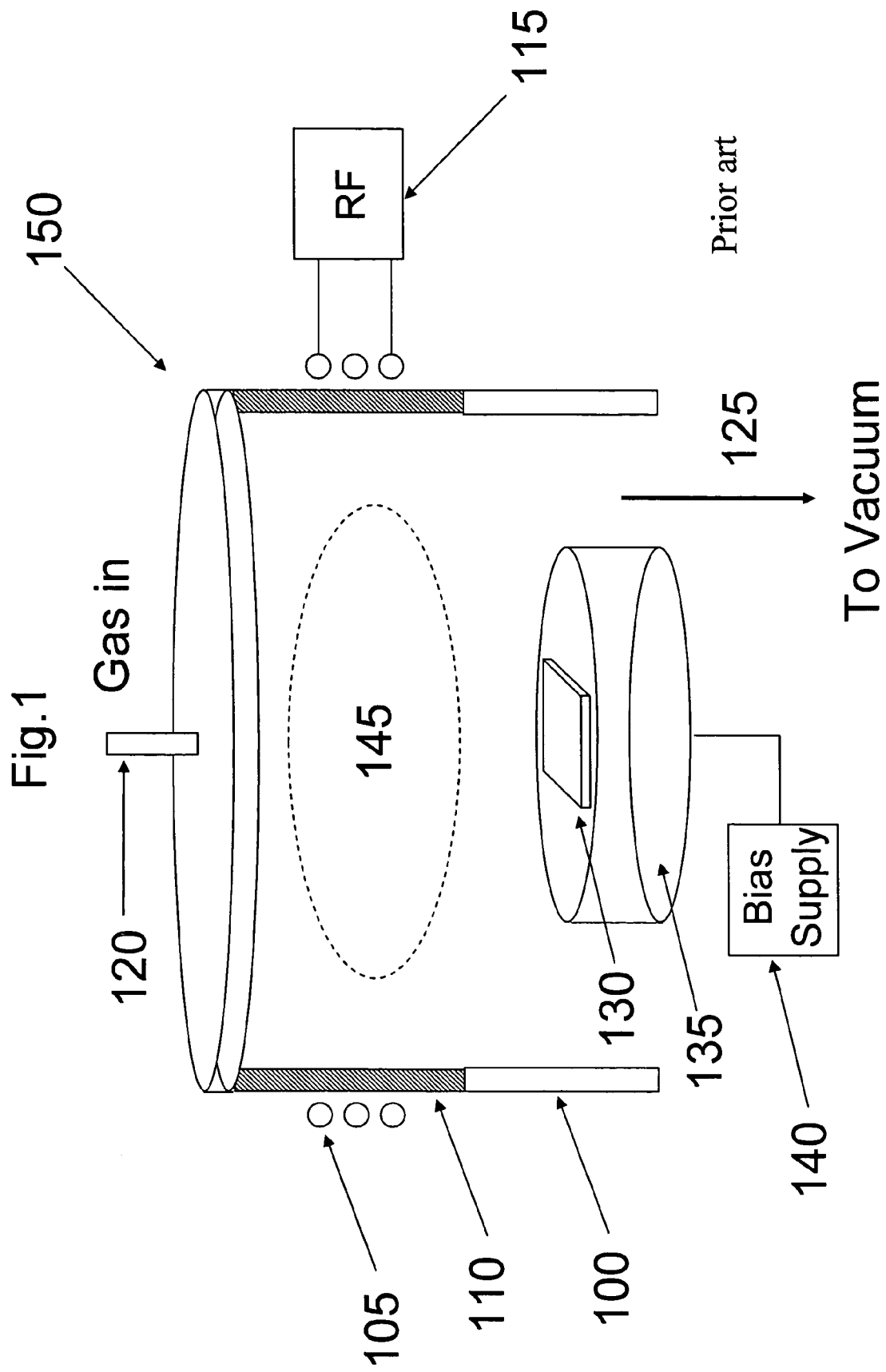
FIG. 1 is a schematic of a typical ICP plasma system.

FIG. 1 is a schematic of an ICP reactor. Process gases are introduced into the chamber 150 through a gas inlet 120. The flow of process gas mixtures is typically regulated by mass flow controllers (not shown). The processing chamber 150 consists of chamber walls 100 and an energy transparent chamber surface 110. The chamber walls 100 are typically metal (e.g., aluminum, stainless steel, etc.), while the energy transparent surface is typically a dielectric (e.g., ceramic). A plasma zone 145 is defined by the chamber walls 100, the substrate support 135, and the energy transparent surface 110. RF energy from an RF generator 115 is supplied to an inductor 105. The RF energy from the generator 115 may be modulated in time (e.g., amplitude, frequency, etc.). The RF energy is coupled to the plasma zone 145 through the energy transparent surface 110. An impedance matching network (not shown) allows efficient transfer of the RF energy from the RF generator 115 to the plasma 145.

A substrate support 135 is disposed within the chamber to support a photolithographic substrate 130 during the process. The substrate support 135 is connected to a voltage supply 140. In the case where the voltage supplied to the substrate support is an RF voltage, an impedance matching network (not shown) is inserted between the bias voltage supply 140 and the substrate support 135. The RF bias may be either voltage controlled or power controlled. The RF bias supply 140 may be modulated in time (e.g., amplitude, frequency, etc.).

In a conventional dry etch process, the temperature of the substrate is actively controlled by keeping the substrate in thermal contact with a temperature controlled substrate support. This is typically accomplished by what is known in the art as helium backside cooling. This is performed by clamping the substrate to the substrate support, either mechanically or electrostatically. In the case of mechanical clamping, a clamp physically contacts the side or top surface of the substrate to hold the substrate in contact with the substrate support. Once held, a gas (e.g., helium) is introduced in the space between the substrate support and the wafer, increasing the heat transfer between the substrate and the substrate support. In order to achieve active substrate temperature control the pressure of the gas between the wafer and substrate support is typically higher than 3 Torr. Alternately, the substrate may be clamped electrostatically to the substrate support with similar backside gas introduction. While electrostatic clamping only contacts the back surface of the substrate, it is difficult to electrostatically clamp dielectric materials. Current photomask substrates are dielectric. If the electrostatic clamping voltage is high enough, it may be possible to clamp "through the substrate" to a conductive or semiconductive layer disposed on top of the substrate.

Due to the defect sensitivity of photolithographic substrates, permissible contact to photomask substrates has been historically limited to the outer 10 mm of the backside of the substrate. The additional substrate contact constraint has precluded clamping photolithographic substrates during dry etch processing. Note, due to the mass of the typical photolithographic substrate, it is possible to introduce a heat transfer gas at low pressures between the substrate and the cathode without clamping (less than about 1 Torr for current 150 mm photomask substrates). While a low pressure gas will provide limited heat transfer to the substrate, backside gas pressures less than 1 Torr are typically insufficient for active temperature control of the substrate, consequently, the temperature of the photomask substrate will rise during exposure to plasma.

Figure 2:
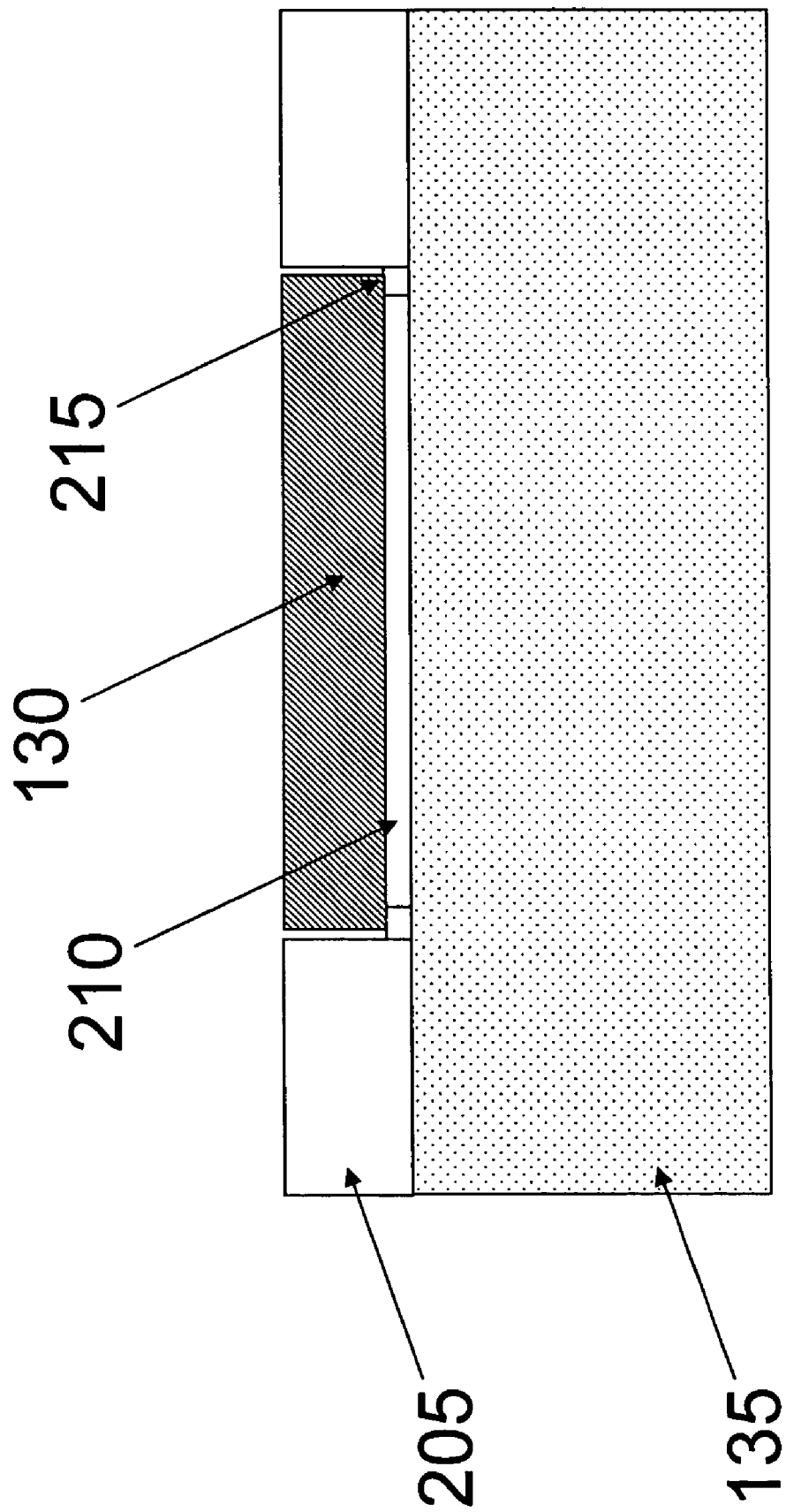
FIG. 2 is a schematic of a substrate support.

FIG. 2 shows that, optionally, the substrate 130 is placed on a support cover plate 205. The cover plate 205 may be in thermal contact with the substrate support 135 or thermally isolated. The support cover plate 205 rests on the substrate support 135. The cover plate typically contains a recess that accommodates the substrate 130 such that the top surface of the substrate and cover plate are approximately coplanar. The cover plate contacts the mask only on the outer edge of the back surface of the reticle 215. The region of contact of the back of the reticle is typically within the outer 10 mm on the back surface of the reticle. The contact between the reticle and the cover plate may be a continuous ledge, point contacts, or some combination therein. Since the coverplate 205 only contacts the reticle 130 at the outer edges of the rear face, there is typically a thin gap 210 between the back face of the substrate 130 and the substrate support 135.

While the temperature of the substrate support is controlled during the process through contact with a heat transfer fluid (not shown) there is only limited heat transfer between the substrate 130 and the coverplate 205. Therefore, in the absence of helium backside cooling, the photolithographic substrate is subject to heating by the plasma during the dry etch process. The rate of heating during the process is a function of the process parameters, including the RF powers, chamber wall temperatures, etc. The photolithographic substrate is typically not actively cooled during the dry etch process. Consequently, the temperature of the substrate will increase during the time it is exposed to the plasma.

For a typical ICP dry etch process for photolithographic substrates, the heat load at the substrate is less than approximately 0.5 W/cm$^2$. Due to the relatively high thermal mass of photolithographic substrates, dry etch processing without active cooling results in minimal temperature rise (typically less than approximately 2° C./minute) during processing. For a typical plasma process used to etch a photolithographic substrate, the total temperature rise is less than approximately 40° C.

Optionally, a diffusion barrier (not shown) may be placed on the cover plate to improve the process etch uniformity.

Process gases and reaction by products are removed from the chamber through a vacuum outlet 125. A throttle valve (not shown) is disposed within the outlet in order to control the chamber pressure during the dry etch process.

Figure 3:
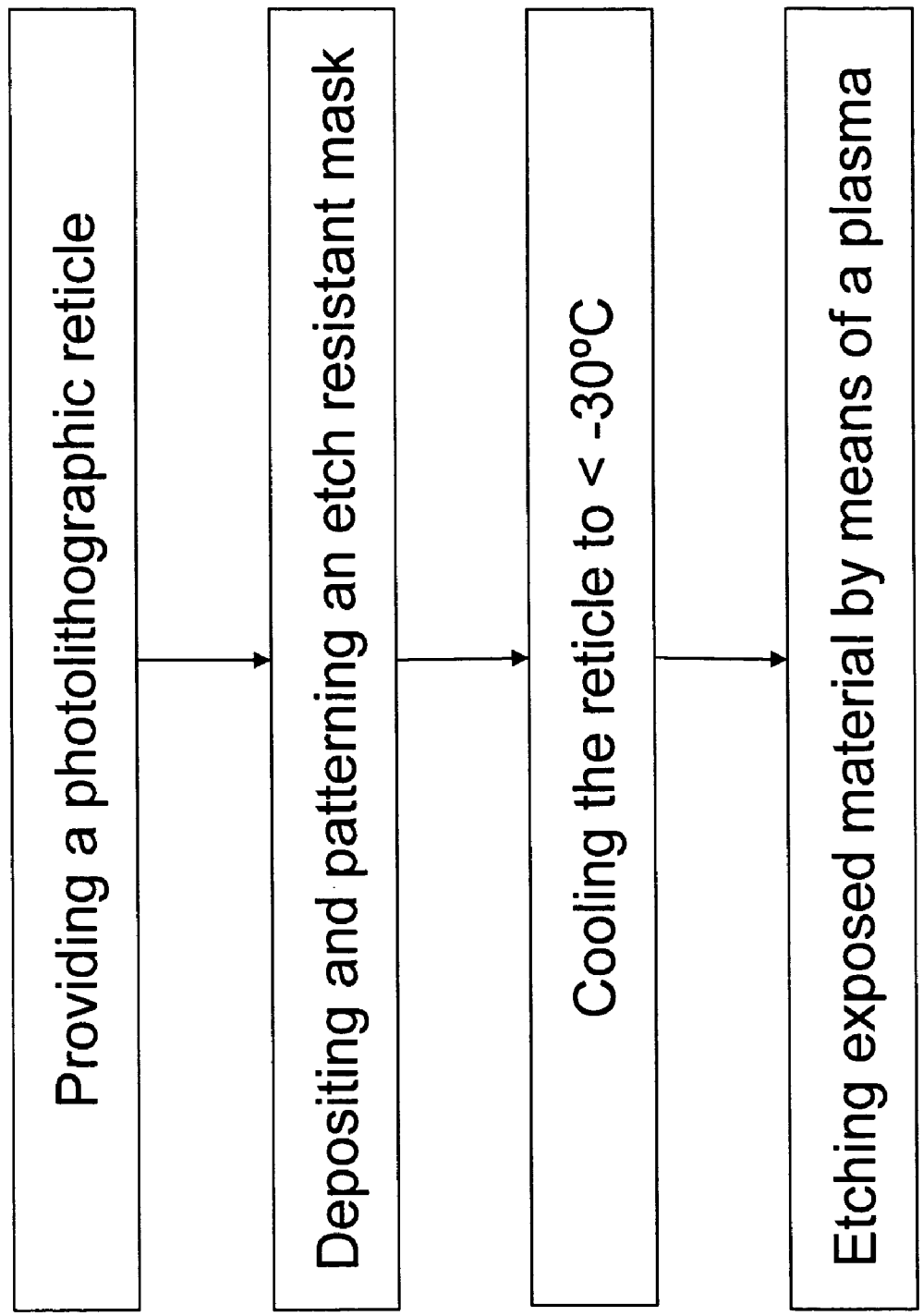
FIG. 3 is a block diagram of the process flow of the present invention.

FIG. 3 shows a block diagram of the process flow. The process starts with a photolithographic substrate with a film to be dry etched. An etch-resistant mask is deposited on the substrate and patterned by methods known in the art. The substrate is then cooled to a temperature of less than about −30° C. Once cooled the substrate is subjected to a plasma process to remove material left exposed by the etch-resistant mask.

Optionally, once the dry etch process is completed, the substrate may be heated to about 20° C. before being exposed to atmospheric conditions. Heating the substrate prior to atmospheric exposure prevents condensation that may adversely affect the mask performance. The heating step may be performed in the plasma reactor. A plasma heating step may be composed of a reactive gas mixture (e.g., oxygen containing gas mixture to strip remaining etch photoresist), or a non-reactive gas (e.g., He, Ar, etc.).

The cooling step prior to etching may occur in the plasma etch chamber, or a separate chamber. During the cooling process, the chamber may be held at a pressure above or near atmospheric pressure or at a pressure less than atmospheric pressure. In all cases the atmosphere should be clean and dry to prevent defect formation on the plate from foreign material or condensation.

In those cases where the substrate cannot be cooled sufficiently to maintain a low enough temperature over the course of the etch, it is possible to segregate the process into multiple segments (e.g., stop the etch and cool the substrate again before resuming the etch process). This can be repeated as many times as necessary.

In processes utilizing more than one process step (e.g., binary Cr photolithographic reticles), the temperature of the substrate can be cooled between each step of the process. Recall, that since there is no active cooling of the substrate during the plasma process, the temperature of the substrate will increase during the course of a plasma processing step. In the case where it is desirable to heat the substrate between steps, a non-reactive plasma may be used to heat the substrate.

It has also been observed that at temperatures less than about −90° C. that the selectivity of Cr:AR Cr increases. At −40° C. the etch selectivity Cr:AR Cr is approximately 1:1. A similar process at approximately −140° C. results in a Cr:AR Cr etch selectivity of approximately 3:1. Based on these observations, at low substrate temperatures, the AR chromium layer may be used as an etch mask for the underlying chromium.

FIGS. 4a-d show a schematic of a typical photomask etch process. In the case where the photomask is a binary Cr mask, FIG. 4a shows an example of a mask structure prior to etch. The structure consists of an optically transparent substrate 415. The optically transparent substrate is broadly defined to include, but not limited to, a material transparent to light having a wavelength of 300 nm or less (e.g., 248 nm, 193 nm, 157 nm). An opaque layer 410 is disposed upon the substrate 415. The opaque layer may be comprised of a metal (e.g., chromium) or other material that is suitable.

An anti-reflective (AR) layer 405 is disposed upon the opaque layer 410. The AR layer 405 is believed to improve the photolithographic performance of the mask. The AR layer may be comprised of a metal derivative (e.g., metal oxides, nitrides, carbides, oxynitrides, etc). Layer 400 represents an etch resistant mask used to pattern the underlying opaque and AR layers. The etch resistant mask may be polymer-based (e.g., photoresist or e-beam resist) or a hardmask material patterned in a previous process step (e.g., SiO$_2$, SiN, DLC, etc).

FIG. 4b illustrates the etch step to remove the AR coating 405. In the case where the AR layer is a chromium containing film, a chlorine based etch process is used. Typically the chlorine-containing gas flow rates range between about 50 sccm and about 400 sccm. Optionally, the AR layer etch process may contain an oxygen containing process gas wherein the oxygen containing gas comprises between 0% about 50% of the total gas flow. An inert gas may also be present in the process gas mixture. The inert gas typically comprises between 0% and about 20% of the total gas flow.

In an ICP configuration, the source power in the AR etch step is typically between about 100 W and about 1000 W. The RF bias power is typically between about 1 W and about 30 W. The RF bias supply may be voltage controlled. The process pressure is typically between about 1 mtorr and about 20 mtorr.

FIG. 4c shows the etch step (and overetch step) to remove the opaque layer 410. In the case where the opaque layer is a chromium containing film, a chlorine containing and oxygen containing etch process is used. Typically chlorine containing gas flows range between about 50 sccm and about 400 sccm. The oxygen containing gas comprises between about 2% to about 50% of the total gas flow. An inert gas may also be present in the process gas mixture. The inert gas typically comprises between 0% and about 20% of the total gas flow. The process parameter for the overetch step may be the same as the opaque layer etch step, or may be different. For example, it is not uncommon to increase the oxygen composition during the opaque layer overetch step to improve feature profiles.

FIG. 4d is a schematic of a typical photomask etch process showing the step to remove the photoresist layer 400.

In an ICP configuration, the source power in the opaque layer etch step is typically between about 100 W and about 1000 W. The RF bias power is typically between about 1 W and about 30 W. The RF bias supply may be voltage controlled. The process pressure is typically between about 1 mtorr and about 20 mtorr.

While conventional substrates can be clamped and cooled to perform processes below room temperature, due to handling restrictions, it is not practical to clamp photolithographic substrates for backside cooling during plasma processing. A photolithographic substrate has a relatively large thermal mass as compared to conventional substrates (e.g., approximately 221 J/K for a 6 inch square fused quartz photomask substrate versus approximately 17 J/K for a 6 inch silicon wafer). Exploiting the relatively large thermal mass of photolithographic substrates, low temperature processing can be achieved without actively cooling the substrate during the process by cooling the substrate prior to etching. Due to the high thermal mass of the substrate, relatively low RF powers, and short process times, the temperature of the photolithographic substrates typically rise less than about 40° C. from the temperature at the start of the process. During the period that the plasma is on, the temperature of the substrate will increase monotonically.

FIGS. 5a & 5c show a prior art example of $Cl_2/O_2$ dry etch results in a low Cr density pattern at room temperature (20° C.). Both examples show a severe slope in the etched feature profile that is detrimental to the optical performance of the photomask.

The inventors have found that decreasing the substrate temperature dramatically changes the etched Cr profile. FIGS. 5b & 5d show examples of $Cl_2/O_2$ dry etch results in a low Cr density pattern at a substrate temperature of –90° C. In FIG. 5b, note that the etch profile is substantially improved, while in FIG. 5d the positive slope has been converted into a negative undercut profile.

While the foregoing description has discussed the invention as applied to etching binary chromium photomasks, it is also contemplated that the invention is also applicable to dry etch processes on other photolithographic substrates such as EAPSM and alternating aperature PSM masks.

It is known in the art to etch molybdenum silicide (MoSi) and molybdenum silicon oxynitride ($MoSi_xN_yO_z$) films using fluorine containing plasmas in the fabrication of EASPM photomasks. During the fabrication of EAPSM masks, it is desirable to achieve a high etch selectivity between the phase shifting material and the underlying substrate. In order to achieve this selectivity, lower ion energy (lower applied RF bias) processes are used. While lowering the RF bias improves selectivity, it does so at the expense of the etch anisotropy—lower RF bias processes result in more isotropic feature profiles. Cooling the photolithographic substrate prior to etching provides improved etch anisotropy at lower RF bias powers.

EXAMPLES

The experiments were performed on a commercially available Mask Etcher 4 system available through Oerlikon USA, St. Petersburg, Fla. In binary Cr photomask etching, it is desirable to achieve high selectivity to photoresist in addition to ensuring high fidelity pattern transfer from the photoresist into the Cr. When the substrates are at room temperature, the higher ICP power (>200 W) and lower oxygen concentration process conditions that achieve Cr:photoresist selectivity >2:1 often result in non-vertical Cr profiles and/or poor pattern transfer fidelity. When the substrates are cooled to lower temperatures, this previously non-viable process space can become useful.

In one experiment, a Oerlikon Mask Etcher 4 system was used to etch four photomasks. The first two masks (Masks 2983 and 2982) were etched at room temperature using a two different etch processes:

|  | Mask ID: | |
| --- | --- | --- |
|  | Mask 2983 | Mask 2982 |
| Process: | "Room Temp/Low $O_2$" | "Room Temp/Moderate $O_2$" |
| $Cl_2$ | 195 sccm | 180 sccm |
| $O_2$ | 5 sccm | 20 sccm |
| Pressure: | 4.5 mT | 4.5 mT |
| RIE: | 800 Vpp | 800 Vpp |
| ICP: | 600 W | 600 W |
| Time (Etch + OE) | 484 + 242 s | 218 + 109 s |
| Selectivity: | 2.8 | 3.0 |

Note:
Both masks were etched to endpoint (as determined by laser reflectance endpoint) followed by a 50% overetch using the same process conditions.

Masks 2984 and 2981 were both cooled to approximately –90° C. prior to plasma etching.

In the process module, the cooled masks were etched using the same process conditions used on the room temperature masks:

|  | Mask ID: | |
| --- | --- | --- |
|  | Mask 2984 | Mask 2981 |
| Process: | "Low Temp/Low $O_2$" | "Low Temp/Moderate $O_2$" |
| $Cl_2$ | 195 sccm | 180 sccm |
| $O_2$ | 5 sccm | 20 sccm |
| Pressure: | 4.5 mT | 4.5 mT |
| RIE: | 800 Vpp | 800 Vpp |
| ICP: | 600 W | 600 W |
| Time (Etch + OE): | 466 + 233 s | 268 + 134 s |
| Selectivity: | 3.3 | 2.9 |

Etch rates varied depending on both temperature and oxygen concentration. At the low oxygen condition, etch rates were ~4% faster at low temperature. At the high oxygen condition, etch rates were about 23% slower. Selectivity to photoresist was approximately the same at either temperature in the high oxygen condition. At low oxygen there was a significant selectivity advantage when operating at low temperature. A closer examination of the etch rates of the photoresist, ARC layer, and bulk Cr layer shows that the selectivities between each layer also varied depending on temperature and oxygen concentration.

Figure 5:
FIG. 5a is a scanning electron photograph showing etch results using the prior art.
FIG. 5b is a scanning electron photograph showing etch results using the present invention.
FIG. 5c is a scanning electron photograph showing etch results using the prior art.
FIG. 5d is a scanning electron photograph showing etch results using the present invention.

FIG. 5 shows the etched Cr profiles for each mask. From these profiles, it is clear that both oxygen and initial substrate temperature have a substantial effect on profile. Low temperature experiments tend to show more vertical or undercut profiles, while the room temperature experiments tend to show more sloped profiles. Oxygen plays a role in that low oxygen experiments tend to be more sloped (or less undercut) than higher oxygen experiments.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for processing a photolithographic substrate, comprising:

loading the photolithographic substrate into a vacuum chamber;

cooling the photolithographic substrate to a target temperature, said substrate is not actively clamped during said cooling step;

introducing at least one processing gas into said vacuum chamber;

igniting a plasma from said processing gas after said cooling step;

processing the photolithographic substrate using said plasma, said substrate is not actively cooled during said processing step; and unloading the photolithographic substrate from said vacuum chamber.

2. The method according to claim 1 wherein said photolithographic substrate is a binary Cr photomask.

3. The method according to claim 1 wherein said target temperature is in a range of less than about minus thirty degrees Celsius.

4. The method according to claim 1 wherein said photolithographic substrate is a phase shift photomask.

5. The method according to claim 4 wherein said phase shift photomask is an embedded attenuating phase shift mask.

6. The method according to claim 1 wherein said processing is plasma etching.

7. The method according to claim 6 wherein said processing gas further comprising a chlorine containing gas and an oxygen containing gas.

8. The method according to claim 7 wherein said chlorine containing gas and said oxygen containing gas are introduced into the vacuum chamber at a ratio of greater than about fifteen to one.

9. The method according to claim 1 further comprising modulating the processing of the photolithographic substrate based on time.

10. The method according to claim 9 wherein said modulation is amplitude modulation.

11. The method according to claim 9 wherein said modulation is pulse modulation.

12. A method of etching a photolithographic substrate, comprising:

loading the photolithographic substrate onto a substrate support within a vacuum chamber;

introducing at least one processing gas into said vacuum chamber;

igniting a first plasma from said processing gas;

etching the photolithographic substrate for a first set of process conditions using said first plasma;

cooling the photolithographic substrate to a target temperature, said substrate is not actively clamped during said cooling step;

igniting a second plasma from said processing gas after said cooling step;

etching the photolithographic substrate for a second set of process conditions using said second plasma, said substrate is not actively cooled during said etching step; and unloading the photolithographic substrate from said vacuum chamber.

13. The method according to claim 12 wherein said cooling step occurs in a second chamber.

14. The method according to claim 12 wherein said cooling step occurs in said vacuum chamber.

15. The method according to claim 12 wherein said photolithographic substrate is a binary Cr photomask.

16. The method according to claim 15 wherein said first set of process conditions using said first plasma etches an anti-reflective layer of said photolithographic substrate.

17. The method according to claim 16 further comprising stripping a photoresist layer prior to etching the remaining Cr on said photolithographic substrate.

* * * * *